United States Patent
Komae et al.

(10) Patent No.: US 10,837,112 B2
(45) Date of Patent: Nov. 17, 2020

(54) SUBSTRATE PROCESSING APPARATUS

(71) Applicant: HITACHI KOKUSAI ELECTRIC INC., Tokyo (JP)

(72) Inventors: Yasuaki Komae, Toyama (JP); Takashi Nogami, Toyama (JP); Kenji Shirako, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 553 days.

(21) Appl. No.: 15/472,450

(22) Filed: Mar. 29, 2017

(65) Prior Publication Data

US 2017/0198397 A1 Jul. 13, 2017

Related U.S. Application Data

(63) Continuation of application No. PCT/JP2015/074235, filed on Aug. 27, 2015.

(51) Int. Cl.
| | |
|---|---|
| *C23C 16/44* | (2006.01) |
| *H01L 21/67* | (2006.01) |
| *H01L 21/673* | (2006.01) |
| *H01L 21/677* | (2006.01) |
| *H01L 21/687* | (2006.01) |
| *C23C 16/52* | (2006.01) |
| *C23C 16/458* | (2006.01) |

(52) U.S. Cl.
CPC .......... *C23C 16/52* (2013.01); *C23C 16/4409* (2013.01); *C23C 16/4584* (2013.01); *H01L 21/67126* (2013.01); *H01L 21/67178* (2013.01); *H01L 21/67303* (2013.01); *H01L 21/67757* (2013.01); *H01L 21/68707* (2013.01)

(58) Field of Classification Search
None
See application file for complete search history.

(56) References Cited

U.S. PATENT DOCUMENTS 5,055,036 A * 10/1991 Asano .................. C30B 35/005
  432/123
5,167,716 A * 12/1992 Boitnott ................ C30B 33/005
  118/715

(Continued)

FOREIGN PATENT DOCUMENTS

| JP | 01-095730 U1 | 6/1989 |
| JP | 2002-173775 A | 6/2002 |

(Continued)

OTHER PUBLICATIONS

Korean Office Action for Korean Patent Application No. 10-2016-7035943 dated May 31, 2017.

*Primary Examiner* — Karla A Moore
(74) *Attorney, Agent, or Firm* — Volpe Koenig

(57) ABSTRACT

A technique for improving stability and safety at the time of boat transfer is provided. A reaction tube configured to process a substrate, a seal cap, provided on an upper surface thereof with a substrate retainer for retaining the substrate, configured to close a furnace opening of the reaction tube, one of a first elevator and a second elevator configured to elevate the seal cap; and another of a first elevator and a second elevator configured to assist the one of the first elevator and the second elevator in elevating the seal cap.

3 Claims, 8 Drawing Sheets

(56) References Cited

U.S. PATENT DOCUMENTS

| | | | | |
|---|---|---|---|---|
| 5,433,784 A | * | 7/1995 | Miyagi | ............... C30B 25/08 |
| | | | | 118/715 |
| 2009/0269933 A1 | | 10/2009 | Yamaguchi et al. | |
| 2011/0179717 A1 | * | 7/2011 | Taniyama | ......... H01L 21/67126 |
| | | | | 49/324 |

FOREIGN PATENT DOCUMENTS

| | | |
|---|---|---|
| JP | 2004-281881 A | 10/2004 |
| JP | 2007-073746 A | 3/2007 |
| JP | 201098048 A | 4/2010 |
| JP | 2011-166112 A | 8/2011 |
| KR | 20080023349 A | 3/2008 |
| KR | 20110088358 A | 8/2011 |

* cited by examiner

US 10,837,112 B2

SUBSTRATE PROCESSING APPARATUS

TECHNICAL FIELD

The present invention relates to a substrate processing apparatus.

RELATED ART

In a vertical substrate processing apparatus, a substrate retainer (boat) retaining a wafer is loaded/unloaded into/from a reaction tube with use of an elevator.

In recent years, there is a trend for increasing a diameter of the wafer, and weight of the wafer and the boat and total weight of a transfer unit are increasing. The increase of weight causes a problem in which the transfer unit partially sags and warps, which makes it difficult to transfer the boat in a stable manner in a state of keeping the boat level at the time of boat transfer.

In JP 2007-73746 A, a closure assisting unit configured to assist a closure force when a furnace opening shutter closes a furnace opening of a reaction tube is disclosed.

SUMMARY OF INVENTION

An object of the present invention is a technique for improving stability and safety at the time of boat transfer.

An aspect of the present invention provides a technology including: a reaction tube configured to process a substrate; a seal cap, provided on an upper surface thereof with a substrate retainer for retaining the substrate, configured to close a furnace opening of the reaction tube; a second elevator configured to elevate the seal cap; and a first elevator configured to assist the second elevator in elevating the seal cap.

According to the present invention, stability and safety at the time of boat transfer can be improved.

DESCRIPTION OF EMBODIMENTS

In the following embodiments, a substrate processing apparatus is configured as a semiconductor manufacturing apparatus configured to perform a process in a method of manufacturing a semiconductor device (IC), for example. Hereinbelow, a first embodiment of the present invention will be described with reference to the drawings.

Figure 1:
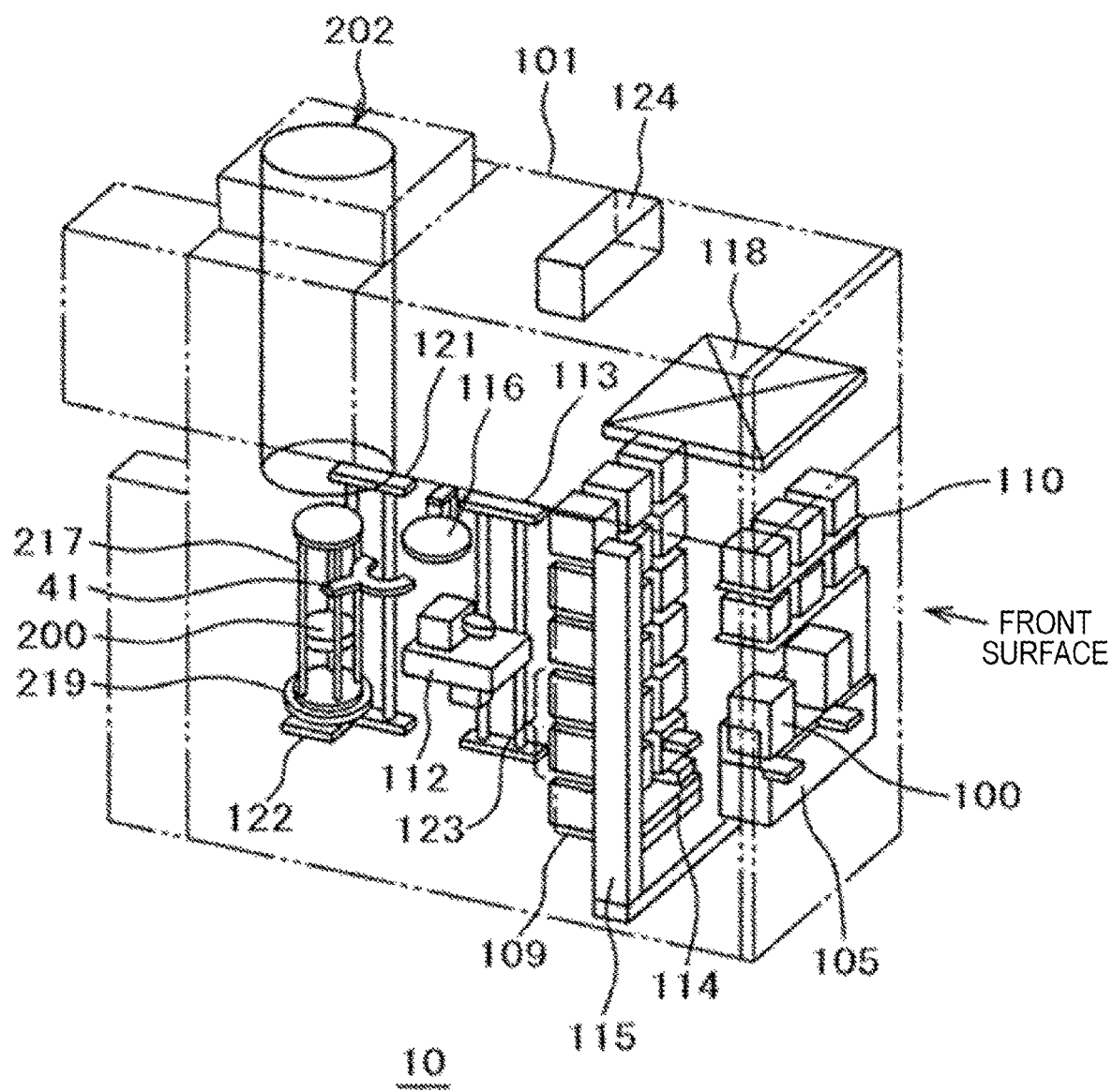
FIG. 1 is a perspective view illustrating a vertical substrate processing apparatus preferably used in an example according to the present invention.

As illustrated in FIG. 1, an I/O stage 105 is provided on a front surface side in a chassis 101 of a substrate processing apparatus 10. The I/O stage 105 provides and receives a pod 100 serving as a substrate housing container to and from a not-illustrated external transfer apparatus. On a rear side of the I/O stage 105, a pod transfer machine 115 is provided. On a rear side of the pod transfer machine 115 is provided a pod shelf 109 for storing the pod 100 therein. As a part of the pod shelf 109, a transfer shelf 123 is provided. The transfer shelf 123 houses therein the pod 100 housing therein a substrate (wafer) 200 to be transferred by a below-mentioned substrate transfer mechanism (wafer transfer machine) 112. The transfer shelf 123 is provided with a pod opener (not illustrated) configured to open/close a lid of the pod. Also, on an upper side of the I/O stage 105 is provided an extra pod shelf 110 for storing the pod 100 therein. On an upper side of the extra pod shelf 110, a clean unit 118 is provided. The clean unit 118 circulates clean air inside the chassis 101.

On a rear side of the transfer shelf, the wafer transfer machine 112 is installed. The wafer transfer machine 112 includes a tweezer tool (retainer for substrate transfer) for retaining the wafer 200 in a leveled state. The tweezer tool can pick up the wafer 200 from the pod 100 located on the transfer shelf 123 to charge the wafer 200 into a substrate retainer (boat) 217 and can discharge the wafer 200 from the boat 217 to house the wafer 200 into the pod 100 located on the transfer shelf 123. The boat 217 is configured to include a plurality of retaining members so as to align a plurality of (25 to 150, for example) wafers 200 in a vertical direction in a leveled and coaxial state, and to retain the wafers 200 in a multiple manner.

On an upper side of a rear portion of the chassis 101, an approximately cylindrical processing furnace 202 is provided. On a lower side of the processing furnace 202, a boat elevator (substrate retainer elevating mechanism) 121 serving as an elevating mechanism is provided along an up-down direction of a side portion of the chassis 101. The boat elevator 121 is configured to elevate the boat 217 having mounted therein the wafer 200 into/out of a reaction tube 203. The boat elevator 121 retains an approximately disk-like seal cap 219 serving as a lid for closing a furnace opening at a lower end of the processing furnace 202. An upper surface of the seal cap 219 is configured to enable the boat 217 to be mounted thereon vertically. Details of a structure of the boat elevator 121 will be described below.

Figure 2:
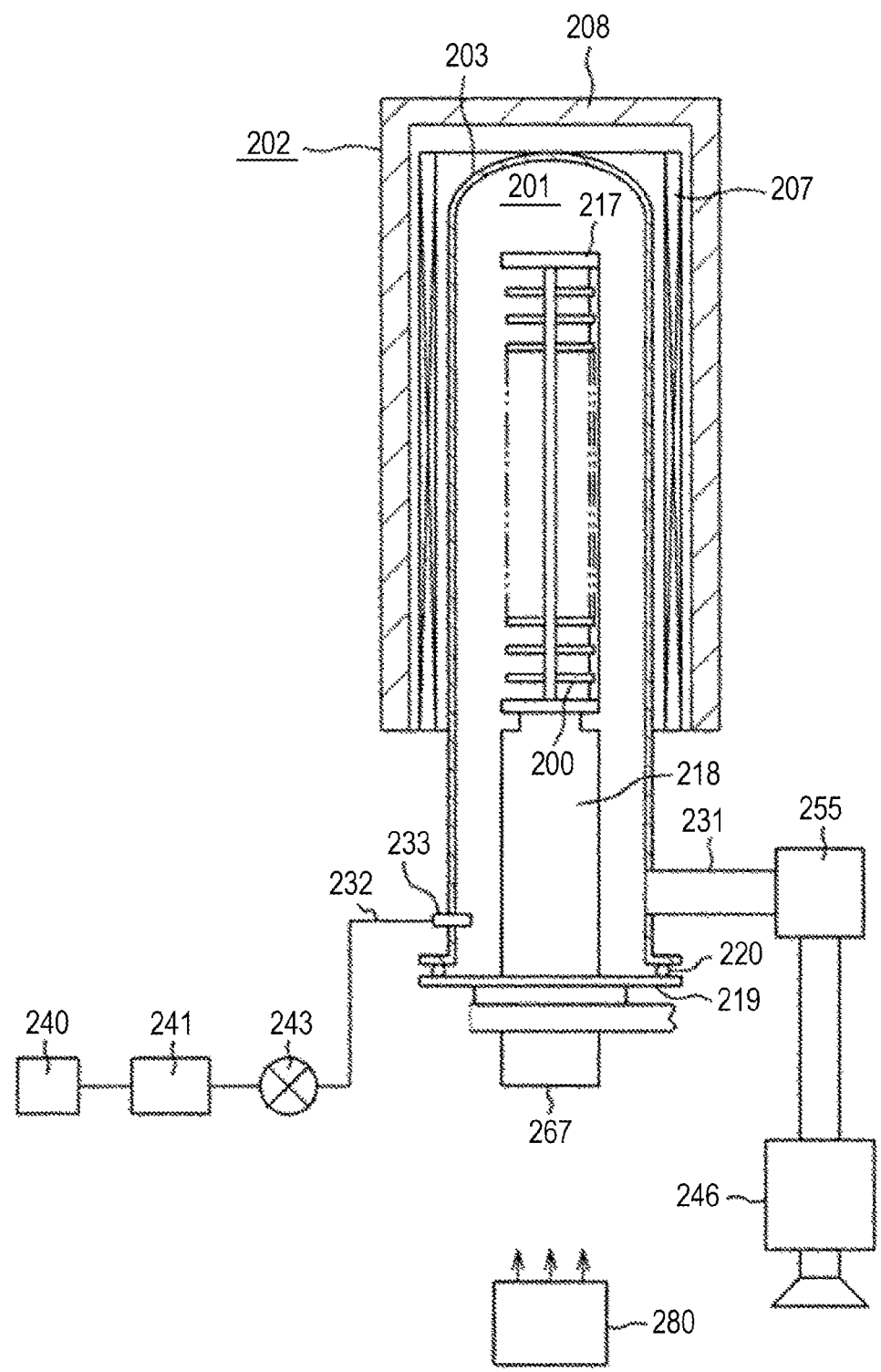
FIG. 2 is a vertical cross-sectional view of a processing furnace of the vertical substrate processing apparatus preferably used in the example according to the present invention.

As illustrated in FIG. 2, the processing furnace 202 includes the approximately cylindrical reaction tube 203 made of quartz. The reaction tube 203 is a reaction container for housing and heating the wafer 200. The reaction tube 203 is provided inside a heater 207 serving as a heating unit. The heater 207 heats the wafer 200 inserted in the reaction tube 203 at a predetermined temperature. As illustrated in FIG. 1, the lower end (furnace opening) of the reaction tube 203 is configured to enable opening/closing by means of a furnace opening shutter (furnace opening opening/closing mechanism) 116 serving as an approximately disk-like lid. The reaction tube 203 is provided therein with a processing chamber 201 for processing the substrate.

As illustrated in FIG. 2, on the seal cap 219 is provided a seal ring (O-ring) 220 serving as a sealing member for sealing a space between the seal cap 219 and the furnace opening of the reaction tube 203. On a side of the seal cap 219, which is an opposite side of a side on which the processing chamber 201 is located, a rotating mechanism 267 for rotating the boat 217 is provided. A not-illustrated rotating shaft of the rotating mechanism 267 passes through the seal cap 219 and retains the boat 217 from the lower side. By rotating the rotating shaft, the wafer 200 can be rotated inside the processing chamber 201.

The boat 217 is inserted into the reaction tube 203 through a lower end opening of the reaction tube 203. At a lower portion of the boat 217 is installed a heat insulating member 218 configured to restrict transmission of heat from the heater 207 to a lower region of the reaction tube 203. The heat insulating member 218 is formed by a cap made of quartz or a plurality of circular-plate-like heat insulating plates made of a heat-resistant material such as quartz and silicon carbide, for example.

Next, a peripheral structure of the reaction tube 203 will be described. As illustrated in FIG. 2, a processing gas supply nozzle 233 for supplying processing gas into the processing chamber 201 is provided to pass through a lower portion of the reaction tube 203. To the processing gas supply nozzle 233, a processing gas supply pipe 232 serving as a processing gas supply line is connected. Although one processing gas supply nozzle is provided in the example in FIG. 2, a plurality of processing gas supply nozzles can be used. The processing gas supply pipe 232 is provided with a processing gas supply source 240, a mass flow controller (MFC) 241 serving as a flow rate control unit, and a valve 243 serving as an opening/closing valve in this order from an upstream side. Processing gas is supplied from the processing gas supply source 240 via the MFC 241, the valve 243, and the nozzle 233 into the processing chamber 201. Primarily, the processing gas supply pipe 232, the MFC 241, and the valve 243 constitute a processing gas supply system. The processing gas supply source 240 and the processing gas supply nozzle 233 may be included in the processing gas supply system.

To the reaction tube 203 is connected one end of a gas exhaust pipe 231 for exhausting gas inside the processing chamber 201. The other end of the gas exhaust pipe 231 is connected via an auto pressure controller (APC) valve 255 to a vacuum pump 246 (exhaust unit). Gas inside the substrate processing chamber 201 is exhausted by the vacuum pump 246. The APC valve 255 is an opening/closing valve that can exhaust gas inside the substrate processing chamber 201 or stop exhausting gas through opening or closing of the valve and is a pressure regulating valve that can regulate pressure through adjustment of the degree of valve opening.

Figure 3A:
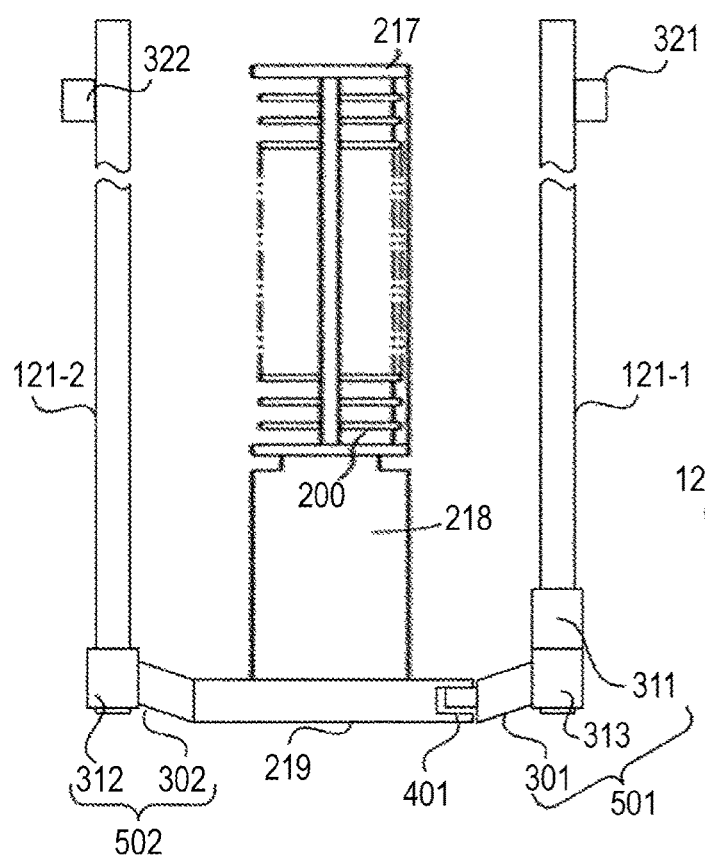
FIG. 3A is a schematic side view of a boat elevator according to a first embodiment of the present invention.
Figure 3B:
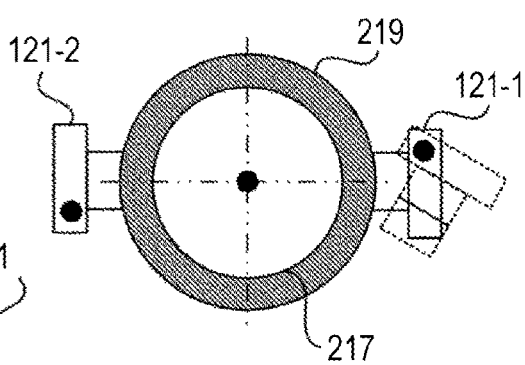
FIG. 3B is a schematic upper view of the boat elevator according to the first embodiment of the present invention.

FIGS. 3A and 3B illustrate a first embodiment of the boat elevator 121 according to the present invention. As illustrated in FIG. 3A, the boat elevator 121 includes a first elevating mechanism (first elevator) 501 serving as an elevating mechanism for assisting elevation of the boat 217 and a second elevating mechanism (second elevator) 502 serving as an elevating mechanism for elevating the boat 217. The first elevator 501 includes a first retaining unit (first arm) 301, a first driving unit 311, and a first arm driving mechanism 313 mentioned below.

As illustrated in FIG. 3B, the seal cap 219 is arranged at a midpoint in a straight line connecting the first elevator 501 to the second elevator 502. In a part of a side surface of the seal cap 219 opposed to the first arm 301, a space (accommodating unit) 401 that can accommodate therein a tip end part (front part) of the first arm 301 is formed. In the present embodiment, the accommodating unit 401 has a polygonal cross-section. The first arm 301 is connected at a rear end thereof to the first driving unit 311 and is configured to enable elevation by means of the first driving unit 311. The first arm 301 is also configured to enable horizontal movement between a accommodating position and an evacuating position mentioned below by means of the first arm driving mechanism 313.

The second elevator 502 includes a second retaining unit (second arm) 302 and a second driving unit 312. The second arm 302 is a retaining unit for retaining the seal cap 219. A front end of the second arm 302 is fixed to the seal cap 219. A rear end of the second arm 302 is connected to the second driving unit 312, and the second arm 302 is configured to enable elevation by means of the second driving unit 312. The seal cap 219 is elevated by the second driving unit 312 via the second arm 302. It is to be noted that, when the term "elevator" is used in the present description, the elevator may include only the first elevator, only the second elevator, or both.

The first driving unit 311 is configured to have a ball screw structure, for example, and includes a first ball screw shaft (first elevator shaft) 121-1 that is engaged with a not-illustrated first nut unit provided in the first arm 301 via a not-illustrated first ball to elevate the first arm 301 in a vertical direction and a not-illustrated first guide support column that slides and guides the first arm 301 in the vertical direction. Also, the first elevator shaft 121-1 is provided at an upper (or lower) end thereof with a first motor 321 that drives the first elevator shaft 121-1 to be rotated. Thus, by driving the first motor 321 to rotate the first elevator shaft 121-1, the first arm 301 is elevated. Mainly, the first nut unit, the first ball, the first elevator shaft 121-1, the first guide support column, and the first motor 321 constitute the first driving unit 311 according to the present embodiment.

The second driving unit 312 is configured to have a ball screw structure, for example, and includes a second ball screw shaft (second elevator shaft) 121-2 that is engaged with a not-illustrated second nut unit provided in the second arm 302 via a not-illustrated second ball to elevate the second arm 302 in the vertical direction and a not-illustrated second guide support column that slides and guides the second arm 302 in the vertical direction. Also, the second elevator shaft 121-2 is provided at an upper (or lower) end thereof with a second motor 322 that drives the second elevator shaft 121-2 to be rotated. Thus, by driving the second motor 322 to rotate the second elevator shaft 121-2, the second arm 302 is elevated. Mainly, the second nut unit, the second ball, the second elevator shaft 121-2, the second guide support column, and the second motor 322 constitute the second driving unit 312 according to the present embodiment.

By means of the first elevator 501 and the second elevator 502, the seal cap 219 and the boat 217 mounted on an upper surface of the seal cap 219 are elevated, and the boat 217 is loaded into the reaction tube 203 and unloaded out of the reaction tube 203.

Figure 5:
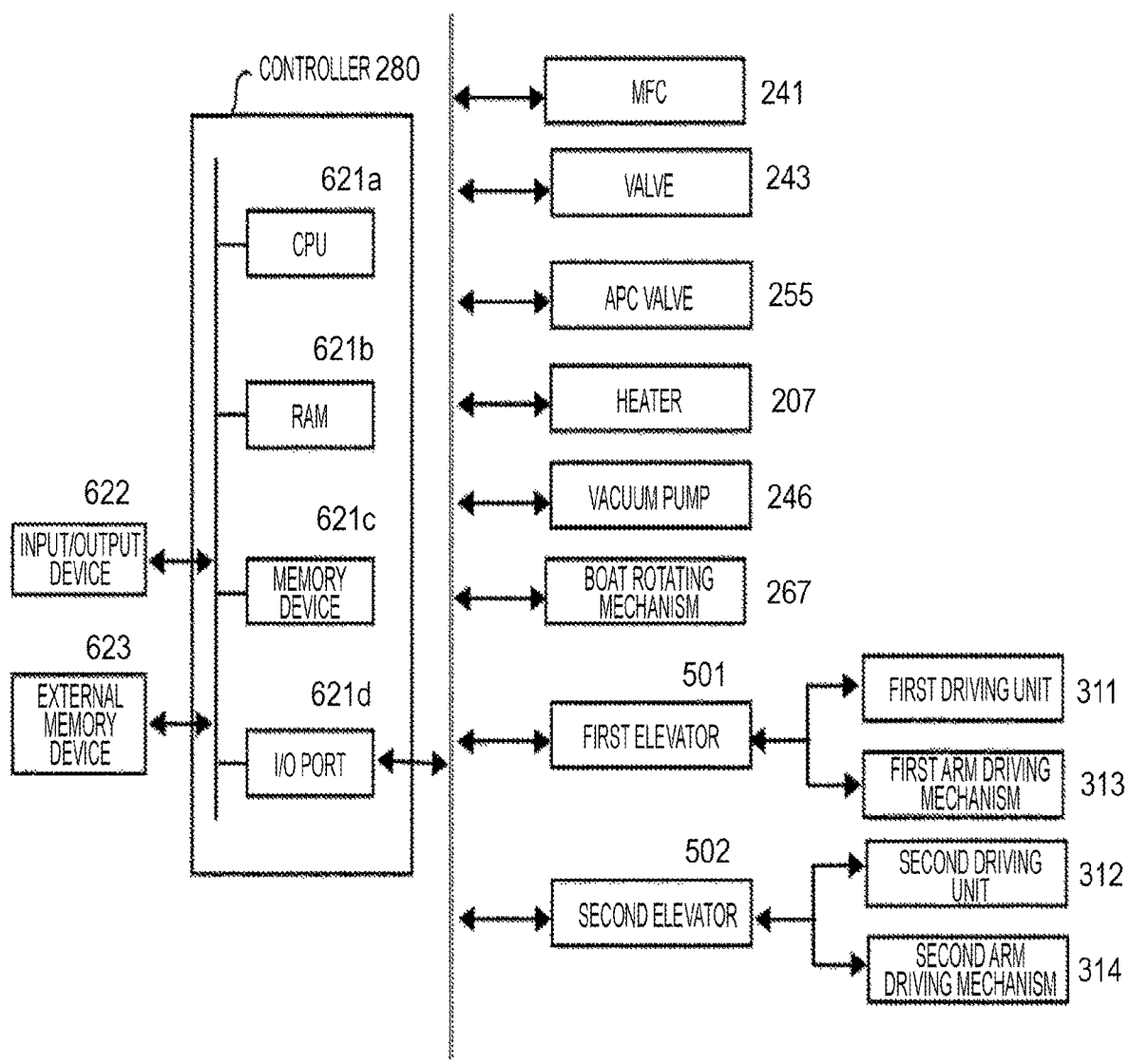
FIG. 5 schematically illustrates a controller configuration according to the present invention and is a block diagram illustrating a control system of the controller.

As illustrated in FIG. 5, a controller 280 serving as a control unit (control means) is configured as a computer including a central processing unit (CPU) 621a, a random access memory (RAM) 621b, a memory device 621c, and an I/O port 621d. The RAM 621b, the memory device 621c, and the I/O port 621d are configured to enable data exchange with the CPU 621a via an internal bus 621e. To the controller 280 is connected an input/output device 622 configured as a touch panel, for example.

The memory device 621c is configured as a flash memory, a hard disk drive (HDD), or the like. In the memory device 621c, a control program for controlling operations of the substrate processing apparatus, a process recipe describing steps, conditions, and the like of below-mentioned substrate processing, and the like are stored to be readable. The process recipe is one in which respective steps of the below-mentioned substrate processing are sequenced to make the controller 280 execute the respective steps and achieve a predetermined result, and functions as a program. Hereinbelow, the process recipe, the control program, and the like are collectively referred to simply as a program. When the term"program" is used in the present description, the program may include only the process recipe, only the control program, or both. The RAM 621b is configured as a memory area (work area) in which programs, data, and the like read out by the CPU 621a are temporarily held.

The I/O port 621d is electrically connected to the respective components of the substrate processing apparatus 10 such as the MFC 241, the valve 243, the APC valve 255, the heater 207, the vacuum pump 246, the boat rotating mechanism 267, the first driving unit 311 and the below-mentioned first arm driving mechanism 313 via the first elevator 501, and the second driving unit 312 and a below-mentioned second arm driving mechanism 314 via the second elevator 502 described above.

The CPU 621a is configured to read out the control program from the memory device 621c to execute the control program and read out the process recipe from the memory device 621c in accordance with an input or the like of an operation command through the input/output device 622. The CPU 621a is configured to control the respective components of the substrate processing apparatus 10 to satisfy the contents of the read process recipe by means of flow rate adjustment for the mass flow controller 241, opening/closing operations for the valve 243, opening/closing and pressure adjustment operations for the APC valve 255, temperature adjustment for the heater 207, start/stop of the vacuum pump 246, rotating speed adjustment for the boat rotating mechanism 267, elevating operation control for the first elevator 501 and the second elevator 502, operation control for the first driving unit 311 and the second driving unit 312, operation control for the first arm driving mechanism 313 and the second arm driving mechanism 314, and the like.

The controller 280 can be configured by installing in the computer the aforementioned program stored in an external memory device (e.g., a magnetic disk such as a magnetic tape, a flexible disk, and a hard disk, an optical disk such as a CD and a DVD, a magneto-optical disk such as an MO, and a semiconductor memory such as a USB memory and a memory card) 623. Each of the memory device 621c and the external memory device 623 is configured as a non-transitory computer-readable recording medium. Hereinbelow, these memory devices are collectively referred to simply as a non-transitory computer-readable recording medium. When the term "non-transitory computer-readable recording medium" is used in the present description, the non-transitory computer-readable recording medium may include only the memory device 621c, only the external memory device 623, or both. It is to be noted that the program may be provided to the computer not with use of the external memory device 623 but with use of a communication means such as the Internet and a dedicated line connection.

With use of the aforementioned substrate processing apparatus 10, processing for forming a film on a substrate (film-forming processing) is performed as a process in a procedure of manufacturing a semiconductor device.

Next, an operation overview of the substrate processing apparatus 10 according to the present invention will be described with reference to FIG. 1. The substrate processing apparatus 10 is controlled by the controller 280. The pod 100 in which the wafer 200 is charged is loaded into the I/O stage 105 from the not-illustrated external transfer apparatus. The pod 100 is subsequently transferred from the I/O stage 105 to the pod shelf 109 or the extra pod shelf 110 by the pod transfer machine 115. The pod 100 having charged the rein the wafer 200 that is to be transferred to the boat 217 is transferred into the transfer shelf 123 by the pod transfer machine 115. When the pod 100 is transferred to the transfer shelf 123, the lid of the pod 100 is opened by the pod opener, and the wafer 200 is transferred from the pod 100 to the boat 217 by the wafer transfer machine 112.

When a predetermined number of wafers 200 are transferred to the boat 217, the boat 217 is inserted into the reaction tube 203 by the boat elevator 121, and the reaction tube 203 is closed in an airtight manner by the seal cap 219. In the reaction tube 203 closed in the airtight manner, the wafer 200 is heated while processing gas is supplied into the reaction tube 203, and the wafer 200 is subject to the film-forming processing.

When the processing of the wafer 200 is completed, the boat 217 is unloaded from the reaction tube 203 in a reverse procedure from the above procedure. The wafer 200 is transferred from the boat 217 to the pod 100 by the wafer transfer machine 112, and the pod 100 is transferred from the transfer shelf 123 to the I/O stage 105 by the pod transfer machine 115 and is unloaded out of the housing 101 by the not-illustrated external transfer apparatus.

In a state in which the boat 217 is lowered, the furnace opening shutter 116 closes the lower end of the reaction tube 203 in an airtight manner to prevent external air from flowing into the processing chamber 201.

Next, operations at the time of boat transfer will be described with reference to FIGS. 3A, 3B, 6, and 7. The boat transfer includes an upward moving operation, a closing operation, an opening operation, and a downward moving operation.

As illustrated in FIG. 3B, before charging the wafer 200 into the boat 217, that is, in a lowered state (standby state) in which no wafer 200 is retained in the boat 217, the first arm 301 is in the evacuating position (dashed-line position in FIG. 3B). The evacuating position is a position in which the first arm 301 does not interfere with the seal cap 219. In the boat lowered state, the first arm 301 is horizontally moved to the accommodating position by the first arm driving mechanism 313 (solid-line position in FIG. 3B). The accommodating position is a position when the first arm 301 has been accommodated in the accommodating unit 401. At this time, a height position of the first arm 301 is adjusted, and the first elevator 501 is controlled so that the seal cap 219 may have predetermined levelness. When the seal cap 219 achieves the predetermined levelness, the controller 280 stores a height position of the first arm 301 at the predetermined levelness (level reference position) and starts charging of the wafer 200 into the boat 217.

Note that the predetermined levelness means levelness that will not have an adverse effect on the wafer 200 even when the boat 217 is inclined. That is, the boat 217 does not have to be completely leveled and may be inclined to the extent that the inclination does not cause displacement of a retaining position of the wafer 200 on the boat 217 and scratches and cracks of the wafer 200. Such inclination is included in a range of the predetermined levelness since the inclination will not have an adverse effect on the wafer 200. That is, the range of the predetermined levelness is from a completely leveled state to an inclined state that does not have an effect on the wafer 200.

When charging of the wafer 200 into the boat 217 is completed, the upward moving operation of the boat 217 is performed with reference to the level reference position. Before starting the upward movement of the boat 217, the height position of the first arm 301 may be adjusted again, and the first elevator 501 may be controlled so that the seal cap 219 may have the predetermined levelness.

Figure 6:
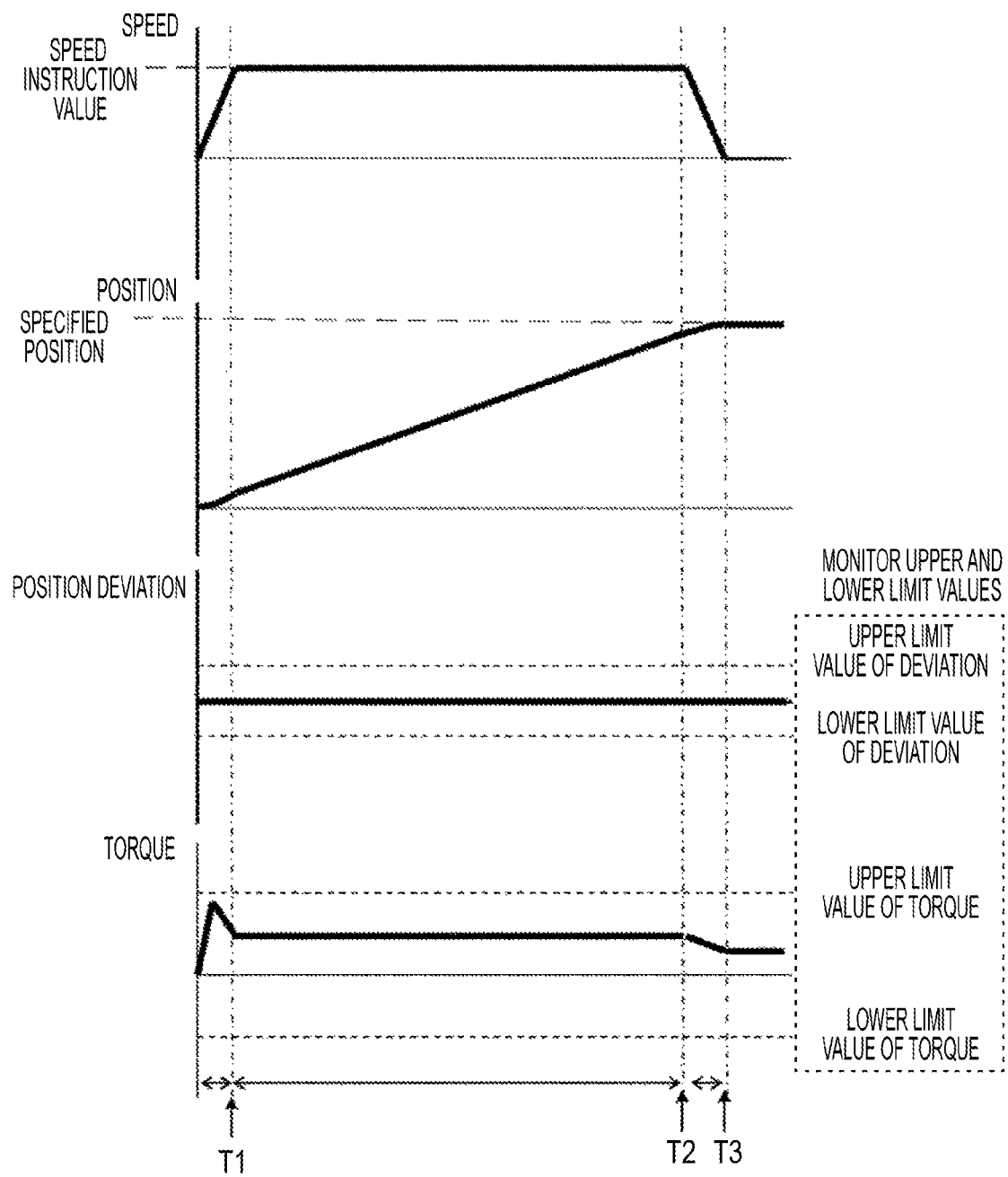
FIG. 6 illustrates monitoring control of speed, a position, and the like of a seal cap elevating mechanism according to the present invention.

As illustrated in FIG. 6, speed control is performed in which, when the boat 217 moves upward, the boat 217 accelerates at a specified rate of acceleration before reaching a speed instruction value (T1), in which, when the speed instruction value is reached, the boat 217 moves upward at constant speed, in which the boat 217 starts deceleration before reaching a specified position (seal position) (T2), and in which the boat 217 stops (T3). The seal position is a height position when the furnace opening of the reaction tube 203 is sealed by the seal cap 219. At this time, the controller 280 instructs the first elevator 501 and the second elevator 502 to have equal speed. That is, the first elevator 501 and the second elevator 502 are controlled by the controller 280 to bring a state in which the first elevator 501 and the second elevator 502 cooperate with each other. Also, the controller 280 monitors absolute position values (motor encoder values), a position deviation value, and torque values for the first elevator 501 and the second elevator 502 to detect a leveled state of the seal cap 219 and controls the first elevator 501 and the second elevator 502 so that the seal cap 219 may keep the predetermined levelness.

Meanwhile, the first arm 301 may not be connected to the seal cap 219 as long as the seal cap 219 keeps the predetermined levelness. That is, the first arm 301 may be in a state of staying at a midair position in the accommodating unit 401 without contacting either an upper surface or a lower surface of the accommodating unit 401. That is, when the seal cap 219 is inclined, the first arm 301 is arranged at a position at which the first arm 301 can contact and retain the seal cap 219 to keep the inclination within the predetermined levelness. By arranging the first arm 301 at such a position, when the boat 217 vibrates, or the seal cap 219 is inclined due to sagging of the second arm 302, the first arm 301 contacts and retains a wall surface inside the accommodating unit 401 of the seal cap 219 to enable the vibration and the inclination of the boat 217 to be alleviated, and the boat 217 can keep the predetermined levelness. Here, the state in which the first arm 301 is connected to the seal cap 219 means a state in which the first arm 301 contacts an inner wall surface of the accommodating unit 401.

After deceleration of the boat 217 is started, the closing operation of the furnace opening of the reaction tube 203 is performed (T2). In a state in which the wafer 200 is charged in the boat 217, the second arm 302 is easy to sag toward the side of the first arm 301 due to the weight of the wafer 200. Thus, at the time of the closing operation, sealing of the seal cap 219 on the side of the first arm 301 is insufficient in some cases. At the time of the closing operation, the controller 280 controls the elevators 501 and 502 to correct the sagging of the second arm 302 or the levelness of the seal cap 219 while monitoring the absolute position values (motor encoder values) of the elevators, the position deviation value between the first arm 301 and the second arm 302, and the torque values of the first motor and the second motor and to press and close the seal cap 219 in the upward direction. At this time, the controller 280 controls the first elevator 501 so as for the first arm 301 to press the upper surface of the accommodating unit 401 in the upward direction. In this manner, when the reaction tube 203 is in a state of being closed in an airtight manner by means of the furnace opening of the reaction tube 203 and the seal cap 219 (in a state in which the seal cap 219 is in the seal position), the wafer 200 is subject to the film-forming processing in the reaction tube 203.

Subsequently, when the film-forming processing to the wafer 200 is completed, the opening operation for opening the furnace opening of the reaction tube 203 is performed. At this time, the seal cap 219 is in a state of being hard to be detached from the furnace opening of the reaction tube 203 due to attachment of the seal cap 219 to the furnace opening of the reaction tube 203. Thus, the controller 280 controls the first elevator 501 so as for the first arm 301 to press the lower surface of the accommodating unit 401 in the downward direction to assist the second arm 302 in pressing the seal cap 219 in the downward direction. At this time, the controller 280 controls the second elevator 502 simultaneously so as for the second elevator 502 to release the attachment in cooperation with the first elevator 501.

During the period from start of downward movement from the seal position to release of attachment to the furnace opening, the speed of each of the first elevator 501 and the second elevator 502 is controlled based on a limit value of the torque, which is a lower value than a value at the time of downward movement after the attachment is released. This limit value is a different value from an upper limit value at the time of boat elevation. When the torque value becomes the limit value, the downward movement speed of each of the first elevator 501 and the second elevator 502 is set to be lower than the downward movement speed when the torque value is the limit value or less. Accordingly, the attachment to the furnace opening is gradually released, and when the furnace opening is opened, vibration of the boat 217 can be reduced.

While the second arm 302 is connected to the seal cap 219 in a fixed state, the first arm 301 is indirectly connected to the seal cap 219 in a non-fixed state. Thus, the first elevator 501 and the second elevator 502 have significantly different torque values. Accordingly, not both the torque values of the first elevator 501 and the second elevator 502 need to be monitored. By monitoring either torque value, the attachment to the furnace opening can be released efficiently in a state of keeping the predetermined levelness and in a state with reduced vibration of the boat 217 at the time of releasing the attachment to the furnace opening. When both the torque values of the first elevator 501 and the second elevator 502 are monitored, the speed control can be performed more accurately.

At the time of the opening operation, the first arm 301 does not always have to assist the second arm 302 in pressing the seal cap 219 in the downward direction. That is, the first elevator 501 may be controlled so that the first arm 301 may alternate an operation of pressing the seal cap 219 and an operation of not pressing the seal cap 219. In this manner, by performing pressing of the seal cap 219 in the downward direction intermittently, the attachment to the furnace opening can be released little by little, and the vibration of the boat 217 at the time of releasing the attachment to the furnace opening can be reduced further. At the time of the operation of not pressing the seal cap 219, the first arm 301 may be in a state of being connected or not being connected to the seal cap.

After the seal cap 219 has been detached from the furnace opening of the reaction tube 203, the boat 217 is moved downward by similar control in a reverse procedure from the upward moving operation.

Figure 7:
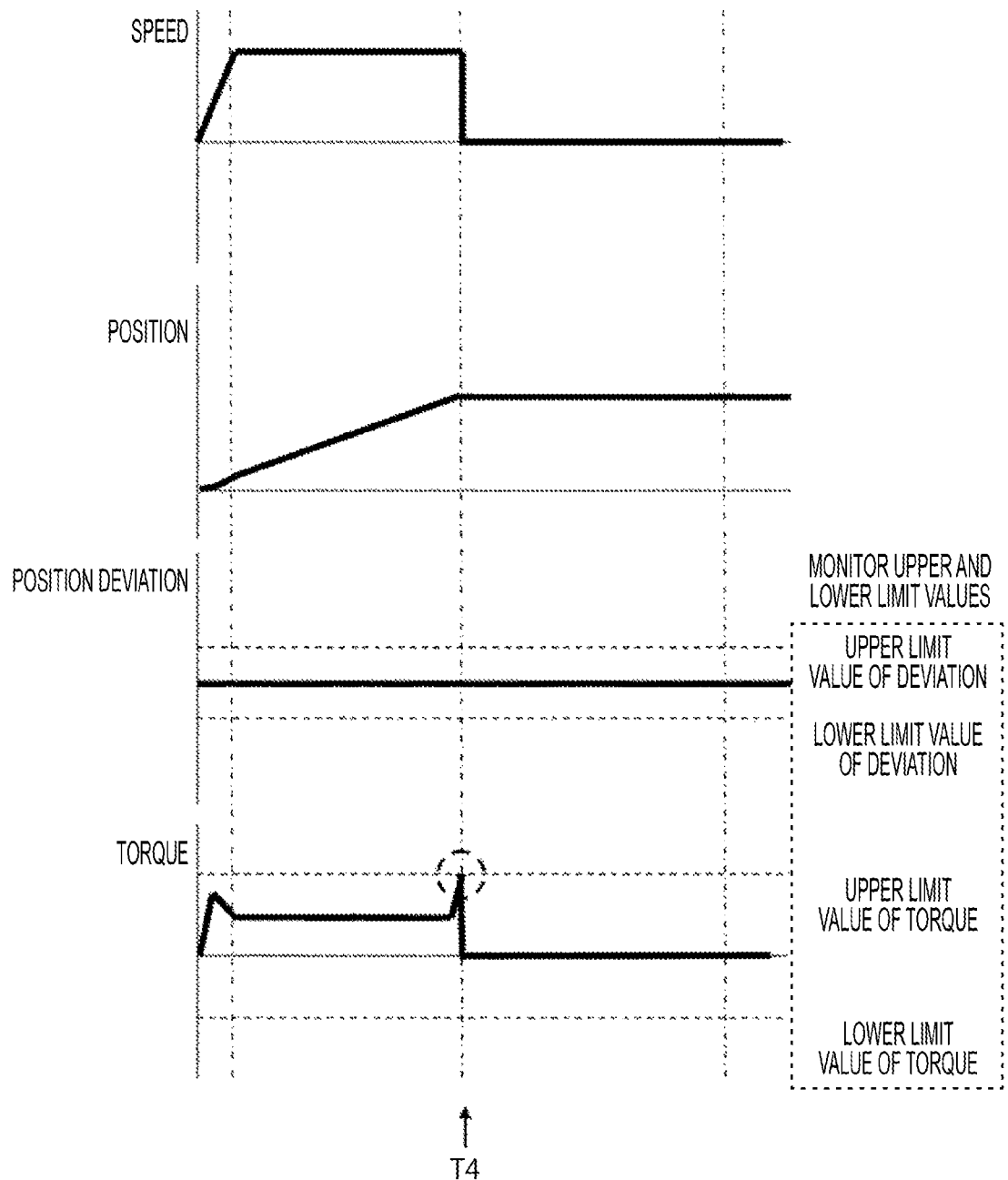
FIG. 7 illustrates control at the time of an abnormal operation of the seal cap elevating mechanism according to the present invention.
Figure 8A:
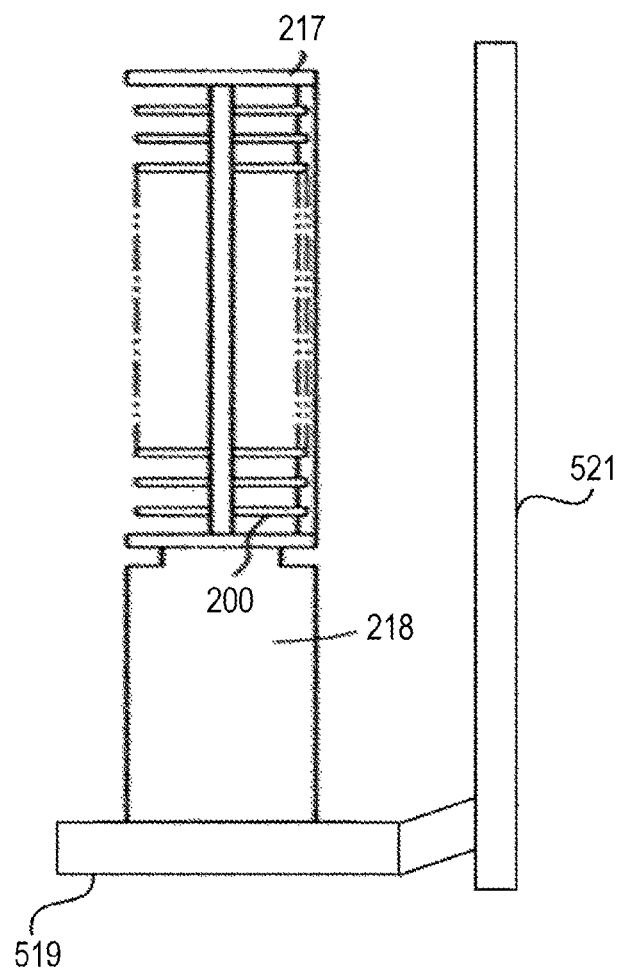
FIG. 8A is a schematic side view of a conventional seal cap elevating mechanism.
Figure 8B:
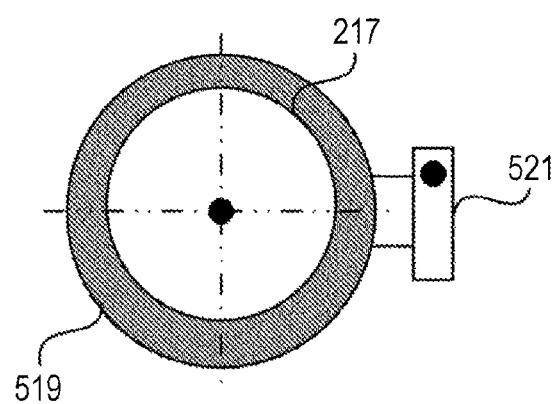
FIG. 8B is a schematic upper view of the conventional seal cap elevating mechanism.

In the aforementioned closing operation, opening operation, and boat upward and downward moving operations, when any of the absolute position values, the position deviation value, and the torque values monitored by the controller 280 exceeds each preset upper limit value, the controller 280 determines that the seal cap 219 does not keep the predetermined levelness or that an abnormality occurs in the seal cap 219 or the elevators 501 and 502 (refer to FIG. 7 (T4)). When it is determined that an abnormality occurs, the boat 217 is decelerated and stopped or suddenly stopped, and an alarm indicating the occurrence of the abnormality is generated.

In the present embodiment, one or a plurality of effects described below can be obtained.

(1) By retaining the seal cap by means of the two boat elevators, boat transfer in a state of retaining the wafer in a stable manner is achieved. While the seal cap is retained at two points at the time of the boat transfer, only one of the two elevators is fixed to the seal cap. When the boat is vibrated or inclined, the elevator that is not fixed contacts and retains the seal cap to enable the inclination of the seal cap and warping of the arms to be alleviated and enable the vibration at the time of boat transfer to be restricted.

(2) By elevating the seal cap while the two elevators cooperate with each other, the seal cap can be transferred in a state of keeping the predetermined levelness. Also, even in a case in which the degrees of sagging of the arms of the respective elevators differ due to the weights of the boat, the seal cap, and the respective elevators, the moving speed and the like of the elevators can be adjusted in accordance with the degrees of sagging of the arms.

(3) Since the arm is not fixed to the seal cap, assembling and carrying-in/carrying-out of the boat elevator is facilitated at the time of assembling the boat elevator, and operability at the time of manufacture is improved.

Figure 4A:
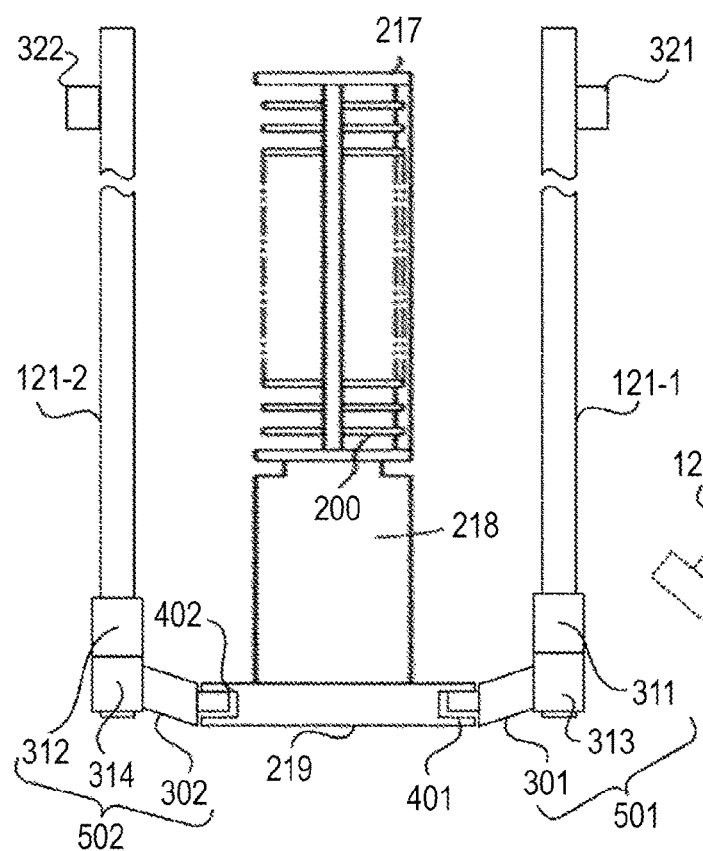
FIG. 4A is a schematic side view of a boat elevator according to a second embodiment of the present invention.
Figure 4B:
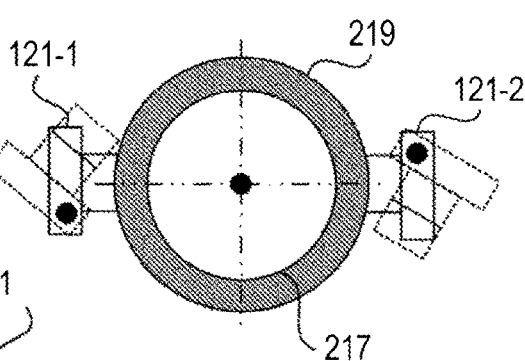
FIG. 4B is a schematic upper view of the boat elevator according to the second embodiment of the present invention.

Next, a second embodiment of the boat elevator according to the present invention will be described with reference to FIGS. 4A and 4B. The second embodiment differs from the first embodiment in that the second arm 302 also has a similar configuration to that of the first arm 301. That is, the second arm 302 is also configured to enable movement between a accommodating position for being accommodated in a second accommodating unit 402 formed on a side surface of the seal cap 219 and an evacuating position (dashed-line position in FIG. 4B) by means of the second arm driving mechanism 314. In this case, the second arm driving mechanism 314 may be included in the second elevator 502.

At the time of the boat transfer, the seal cap 219 is in a state of being connected to either or both the first arm 301 or/and the second arm 302. For example, at the time of the upward moving operation, the seal cap 219 may be transferred while an upward moving operation in a state in which the first arm 301 is connected and an upward moving operation in a state in which the second arm 302 is connected are alternated. This configuration enables load caused by the weight to be distributed further than a configuration in which one elevator is fixed to the seal cap, which can extend duration of the transfer unit.

It is to be understood that the present invention is not limited to the above examples and can be altered in various ways without departing from the scope of the present invention. Also, although the present invention has been described with use of the vertical substrate processing apparatus in the above examples, the present invention can be applied to a horizontal apparatus. Also, although a case in which the wafer is subject to a heat treatment has been described in the above examples, a processed target may be a photomask, a printed circuit board, a liquid crystal panel, a compact disk, a magnetic disk, or the like.

The present invention can suitably be applied to another substrate processing operation such as diffusion processing, annealing processing, oxidation processing, nitriding, and lithographic processing, as well as the film-forming processing. Also, the present invention can suitably be applied to another substrate processing apparatus such as an annealing processing apparatus, an oxidation processing apparatus, a nitriding apparatus, an exposure apparatus, a coating apparatus, a drying apparatus, and a heating apparatus, as well as the thin film forming apparatus.

The present invention can suitably be applied to a substrate processing apparatus for processing a glass substrate such as a liquid crystal display (LCD) manufacturing apparatus, as well as the substrate processing apparatus for processing a wafer substrate such as the semiconductor manufacturing apparatus according to the present embodiments.

Priority is claimed to Japanese Patent Application No. 2014-200884, filed on Sep. 30, 2014, the entire content of which is incorporated herein by reference.

According to a semiconductor manufacturing apparatus according to the present invention, stability and safety at the time of boat transfer can be improved.

The invention claimed is:

1. A substrate processing apparatus comprising:
a reaction tube configured to process a substrate;
a seal cap, provided on an upper surface thereof with a substrate retainer for retaining the substrate, configured to close a furnace opening of the reaction tube;
a first elevator and a second elevator configured to elevate the seal cap; and
a controller configured to control the first elevator and the second elevator,
wherein one of the first elevator and the second elevator is configured to assist the other one of the first elevator and the second elevator in elevating the seal cap, and
wherein the first elevator includes;
a first arm configured to connect with and disconnect from the seal cap and retain the seal cap when connected with the seal cap; and
a first driving unit including a first elevator shaft and a first motor and configured to elevate the first arm along the first elevator shaft,
wherein the second elevator includes:
a second arm, fixed to the seal cap, configured to retain the seal cap; and
a second driving unit including a second elevator shaft and a second motor and configured to elevate the second arm along the second elevator shaft,
wherein the seal cap includes a first recessed portion, disposed at a side surface of the seal cap opposed to the first arm, configured to receive and engage the first arm,
wherein the controller is configured to control the first driving unit and the second driving unit to cause the first arm not to contact an inner wall surface of the first recessed portion when the seal cap is being elevated, wherein the controller is configured to control the first driving unit and the second driving unit to cause the first arm to follow the second arm when the seal cap is elevated, wherein the controller is configured to control the first arm to be moved between an accommodating position for receiving and engaging the first arm at the first recessed portion and an evacuating position for disconnecting and evacuating the first arm from the first recessed portion, wherein the control unit is configured to control the first driving unit and the second driving unit so that the first arm is moved to the accommodating position in a state of stopping elevation of the seal cap, wherein the controller is configured to control the first driving unit and the second driving unit so that, after the seal cap contacts the furnace opening, the first arm assists the second arm in pressing the seal cap in an upward direction.

2. The substrate processing apparatus according to claim 1, wherein the first recessed portion is formed in a polygonal shape.

3. The substrate processing apparatus according to claim 1, wherein the first elevator and the second elevator are installed in positions opposed to each other with the seal cap interposed therebetween.

* * * * *